United States Patent [19]

Diamond et al.

[11] 4,180,414
[45] Dec. 25, 1979

[54] CONCENTRATOR SOLAR CELL ARRAY MODULE

[75] Inventors: Ronald M. Diamond, Shadow Hills; Ku S. Ling, Glendora; Allen G. Winterer, La Habra, all of Calif.

[73] Assignee: Optical Coating Laboratory, Inc., Santa Rosa, Calif.

[21] Appl. No.: 923,091

[22] Filed: Jul. 10, 1978

[51] Int. Cl.$^2$ .................................... H01L 31/04
[52] U.S. Cl. ...................... 136/89 PC; 136/89 CA; 357/81; 357/82
[58] Field of Search ........ 136/89 PC, 89 CC, 89 CA; 357/30, 81, 82

[56] References Cited

U.S. PATENT DOCUMENTS

| | | | |
|---|---|---|---|
| 3,615,853 | 10/1971 | Paine et al. | 136/89 |
| 3,769,091 | 10/1973 | Leinkram et al. | 136/89 |
| 3,833,425 | 9/1974 | Leinkram et al. | 136/89 |
| 4,056,405 | 11/1977 | Varadi | 136/89 PC |
| 4,062,698 | 12/1977 | Blakeslee et al. | 136/89 PC |
| 4,069,812 | 1/1978 | O'Neill | 126/271 |
| 4,090,359 | 5/1978 | Doellner | 60/39.69 R |

*Primary Examiner*—Aaron Weisstuch
*Attorney, Agent, or Firm*—Flehr, Hohbach, Test, Albritton & Herbert

[57] ABSTRACT

A concentrator solar cell array module having a metallic heat sink with a planar mounting surface. A semiconductor spacer is provided. The semiconductor spacer is provided with a layer of insulating material in the form of silicon oxide. The silicon oxide surface is secured to the mounting surface of the heat sink by a thermally conductive adhesive. A semiconductor solar cell is provided. Solder is utilized for securing the solar cell to the spacer. A glass cover is secured to the solar cell by an adhesive. The glass cover is provided with a textured surface to cause diffusion of the light impinging upon the solar cell.

8 Claims, 4 Drawing Figures

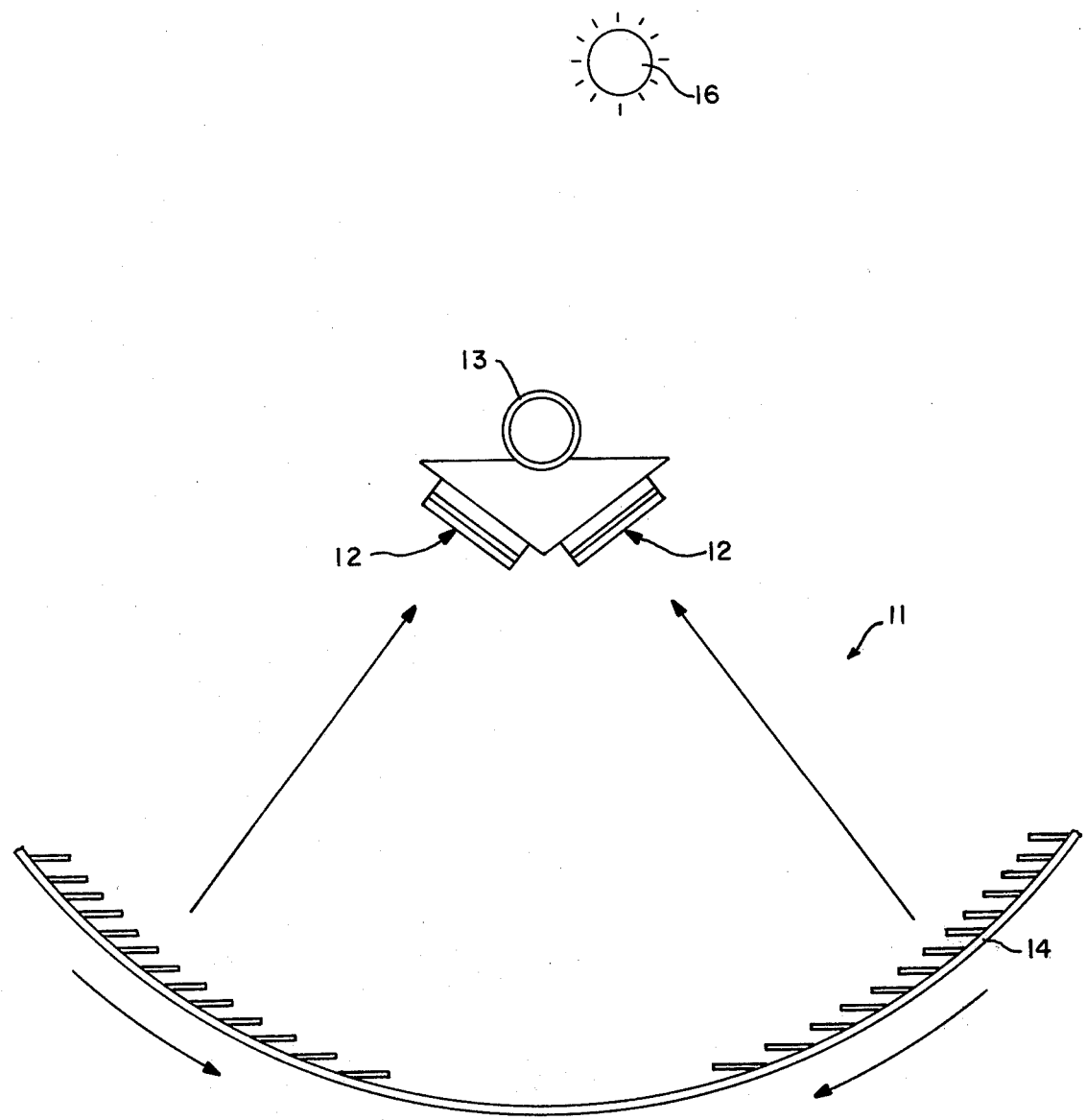
FIG.—1
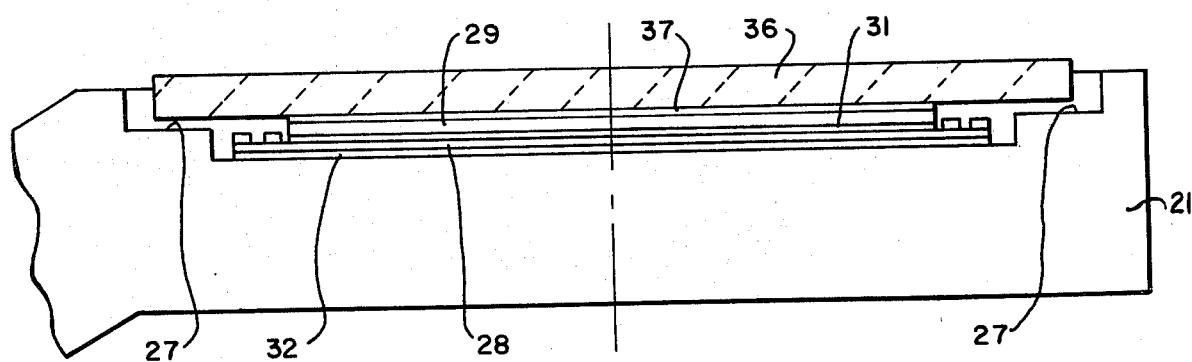
FIG.—3

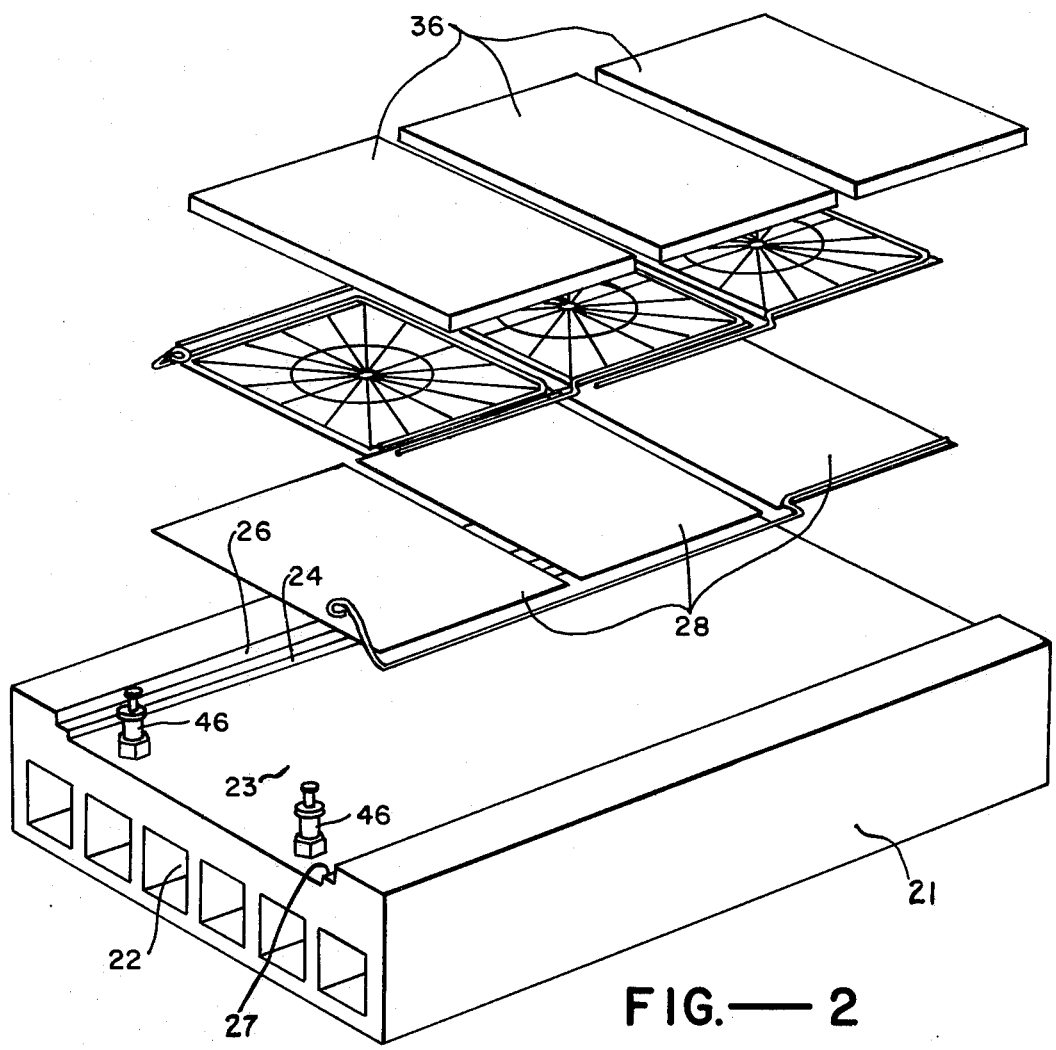
FIG.—2
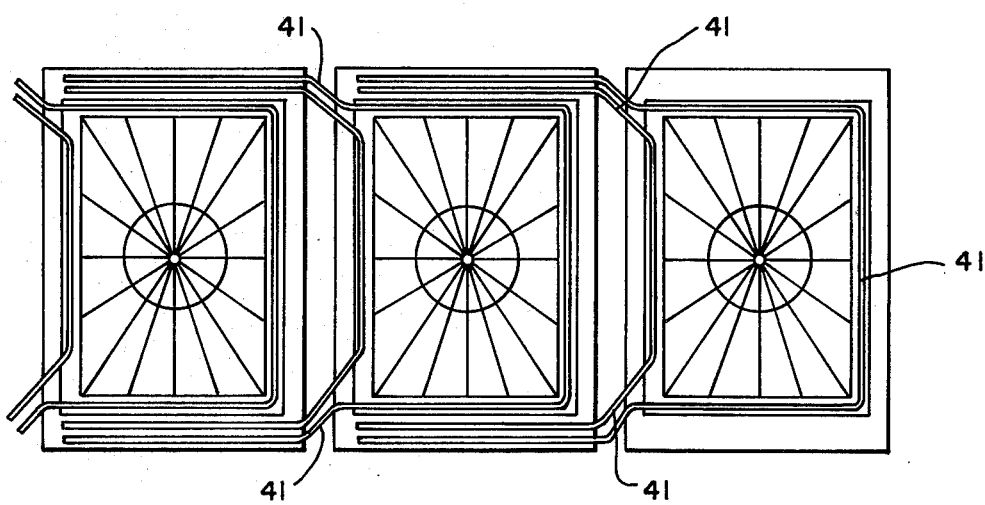
FIG.—4

CONCENTRATOR SOLAR CELL ARRAY MODULE

BACKGROUND OF THE INVENTION

Concentrator solar cell array modules have heretofore been provided. In such modules, the solar cell has been mounted directly on the heat sink. Such modules had disadvantages in that they had poor conductivity and the insulation could break down. There is therefore a need for a new and improved concentrator solar cell array module.

SUMMARY OF THE INVENTION

The concentrator solar cell array module consists of a metallic heat sink which has a planar mounting surface. A thin semiconductor spacer essentially of the same material as the solar cell is provided. The spacer is provided with an insulating layer which faces the mounting surface of the heat sink and the spacer is formed of silicon that comprises an oxide of silicon. A conductive adhesive secures the spacer to the planar mounting surface of the heat sink. A semiconductor solar cell is provided. A thin pressed layer of solder is utilized for securing the bottom side of the solar cell to the top side of the spacer. A cover glass which diffuses the sunlight is secured to the solar cell by a resilient optically transparent silicon adhesive. Braided wires are used for connecting the solar cells in series.

In general, it is an object of the present invention to provide a concentrator solar cell array module which has excellent heat tranfer characteristics.

Another object of the invention is to provide a module of the above character which has interconnective capabilities.

Another object of the invention is to provide a module of the above character which has substantially matched thermal expansion characteristics and superior electrical insulation.

Another object of the invention is to provide a module of the above character in which the thermal resistance path of the cell to the substrate is substantially reduced by an order of magnitude while still providing electrical isolation.

Additional objects and features of the invention will appear from the following description in which the preferred embodiments are set forth in detail in conjuncton with the accompanying drawing.

BRIEF DESCRIPTION OF THE DRAWING

FIG. 1 is a side elevational view of a linear Fresnel concentrator system.

FIG. 2 is an exploded view of a portion of a concentrator solar cell array module utilized in a system such as shown in FIG. 1 and incorporating the present invention.

FIG. 3 is a cross-sectional view of a concentrator solar cell array module incorporating the present invention.

FIG. 4 is a plan view of the concentrator solar cell array module showing the manner in which braided wires are utilized for interconnecting the solar cells.

DESCRIPTION OF THE PREFERRED EMBODIMENT

In FIG. 1, there is shown a linear concentrator system 11 which utilizes a concentrator solar cell array module 12 incorporating the present invention. The modules 12 are described in detail hereinafter and can be of any suitable length, as for example to provide a desired voltage such as 110 volts DC. To obtain such a voltage, two hundred twenty four solar cells are aprovided to provide a module 16 which is 16 feet in length. The modules 12 are cooled with a suitable liquid coolant. The modules 16 are supported by a pipe support 13 in such a manner so that the modules are separated by a suitable angle as for example 40°, and are facing a reflecting surface such as that provided by linear Fresnel reflector 14. The reflector 14 is adapted to receive rays from the sun 16 and to direct the same onto the concentrator solar cell array modules 12. Means is provided for causing the modules 16 to move about the pipe support 13 to track the sun on one axis only to maximize the energy received from the sun.

Each of the concentrator solar cell array modules as shown in FIGS. 2 and 3 consists of a large heat sink 21 formed of a suitable material such as aluminum. It is provided with a plurality of channels or passages 22 extending longitudinally of the heat sink and which are adapted to receive a coolant for cooling the heat sink 21. The heat sink 21 is provided with a planar surface 23 extending longitudinally of the heat sink on the top side of the same. The surface 23 is formed by a U-shaped recess 24 extending longitudinally of the heat sink. Another U-shaped recess 26 is also formed in the heat sink and extends longitudinally of the heat sink so that there are provided steps 27 on the opposite sides of the surface 23.

In accordance with the present invention, a spacer 28 is provided that is to underlie each of the solar cells 29 which are to be mounted upon the heat sink 21. The solar cells 29 can be of the type described in copending application Ser. No. 935,526, filed Aug. 21, 1978. As described therein, the solar cells are formed of silicon. When this is the case, the spacers 28 are also essentially formed of silicon so that they have the same coefficient expansion as the solar cells. The spacers 28 are formed to a suitable thickness as for example, 12 mils, although the thickness can range from 8 to 20 mils. The silicon spacer can also have any desired conductivity ranging from ½ to 15 ohm-centimeters. In addition, the silicon can be of a P type. However, in order to increase the insulation properties of the spacer, an insulating layer is provided on the side of the spacer which is to face the surface 23. This is accomplished by thermal oxidation in which a layer of silicon oxide is formed on all sides of the spacer. The silicon oxide layer remote from the side which is facing the surface 23 is removed in a suitable manner such as by masking the opposite side and utilizing a conventional etch to remove the silicon oxide from the exposed side. The titanium-palladium silver contact is applied to the side without the silicon oxide, followed by a heat treatment in a reducing atmosphere. The metal contact is overcoated with a thin layer of solder by pressing.

After this has been accomplished, the spacer 28 is press soldered to the titanium-palladium-silver contact structure provided on the bottom of the solar cell to create a continuous "P" type contact which collects current from the cell. This can be accomplished by placing a thin layer of solder 31 on the silver layer carried by the solar cell by silk screening or by dipping the solar cell in solder. The solar cell can be placed in a fixture and the spacer can be placed on top of the same and the entire assembly heated up until the solder melts to bond the solar cell to the spacer. The spacer 28 with the solar cell 29 on top is secured to the heat sink 21 by a layer 32 of thermally conductive silicone adhesive having a thickness ranging from 3 to 5 mils. Any suitable silicone semiconductive thermal aduesive can be utilized as for example, Berlon (trademark), which is a silicone adhesive filled with beryllium oxide. Berlon is supplied by National Beryllia Corp. of Haskell, N.J. 07420. It has a thermal conductivity ranging from 0.7 to 2.1 rates in BTU's per hour per square foot per °F. per foot. It has been found preferable to utilize B5 0201 because it has low thermal conductivity and also because it has low viscosity which makes it easy to spread so that it is very thin, ie., 3 to 4 mils in thickness. It has a high thermal conductivity. It will be noted that the size of the solar cell 29 is less than that of the spacer 28 so that there is provided space for leads as hereinafter described on the opposite sides of the spacer 28. The spacer 28 which acts as a part of the interconnective system has the same thermal expansion characteristics as the solar cell because it is formed of the same material and thus assists in equalizing the lateral temperature profile across the cell. The oxide film or layer provided on the spacer 28 provides excellent electrical isolation.

The layer of silicone adhesive 32 acts to provide additional electrical isolation of the solar cell. This adhesive will take up the differences in the mismatch of the coefficients of expansion of silicon and the substrate surface 23 provided by the heat sink 21, thus minimizing the stresses to the solar cell and essentially allowing the solar cell to float on the substrate.

In order to enhance the capabilities of the module, a solar cell cover 36 is provided. By way of example, this cover can be in the form of a Sunadex water white glass shield having a thickness ranging from 100 to 150 mils and preferably a thickness of 125 mils. The cover 36 is bonded to the top of the solar cell 29 by a suitable adhesive 37 such as a resilient optically transparent silicone adhesive such as RTV 602. This cover glass 36 is provided with a mottled surface which serves as a diffuser for the sunlight and which improves electrical performance of the cell 29.

Series connection of the solar cells mounted on the heat sink 21 is accomplished with the use of redundant silver plated copper flat braided wires formed into U-shaped sections and spot soldered along the "P" contacts on both sides and around the perimeter of one cell to the "N" contacts of the adjacent cell. This braided wire system which has the equivalent of four wire redundancy will provide excellent expansion/contraction properties for the cells, reducing stress on the cell and contact solder joints and allows total collection of current from the cells and the total passage of current from cell to cell in the event of cells cracking or being broken during operation. Additionally, the solder connections of each cell are visible at all times for inspection.

The manner in which the U-shaped sections 41 are located in position on the cells is shown in FIG. 4. Thus, as shown, the first U-shaped section 41 extends around three sides of the first solar cell and extends downwardly along the sides of the second solar cell. The next U-shaped section 41 covers the remaining fourth side of the first solar cell and then extends over the other two sides of the same solar cell. The next U-shaped section covers the top side and the two sides of the solar cell and extends down into the next solar cell. Thus, it can be seen that the solar cells are connected in a series.

When the bypass diodes are required to protect against cell shadowing, the diodes can be installed adjacent to the cells on the silicon spacer. To protect the wiring and cell contacts, a flexible transparent coating of silicone adhesive can be applied to the wires, contacts and spacings of the cells.

For electrical attachment to the module, redundant standoff terminals are provided on opposite ends of the heat sink 21. The terminals have the capability of a standoff voltage well in excess of 1000 volts and each is capable of carrying 15 amperes of current. Thus, as shown in FIG. 2, the positive terminals 46 are on one end. The negative terminals which are on the other end, are not shown.

It can be seen from the foregoing that there is provided a mounting system for attachment of concentrator solar cells to metallic substrates or heat sinks to minimize temperature gradients between the cell and the substrate. The insulated spacer is utilized with one side bonded to the heat sink or substrate using thermally conductive adhesive for attachment. To provide electrical isolation, a thermally grown silicon oxide layer is formed on the side of the spacer 28 bonded to the substrate. The module provides a means for maximum heat transfer and of energy from the cells to the substrate while maintaining high electrical isolation. Matched thermal characteristics are provided for the cell and the electrical isolation provided by the spacer. The module utilized in the present invention reduces the temperature gradient to less than 1° C. in comparison to a gradient 6° C. for the prior art structures. The spacer acts as an electrical isolator and electric interconnector which allows for total collection and passage of current from the cell in the event of cell breakage. By making use of a silicon spacer which has a relatively high thermal conductivity and by applying an oxide insulating layer, the thermal resistance path from the solar cell to the substrate or heat sink is substantially reduced by an order of magnitude while still providing the necessary electrical isolation.

What is claimed is:

1. In a concentrator solar cell array module, a metallic substrate serving as a heat sink and having a planar mounting surface, a semiconductor spacer having opposed front and back surfaces with an insulating layer formed on said back surface, a thermally conductive adhesive for securing said spacer to said mounting surface of said substrate with the insulating layer of the spacer facing the mounting surface, a semiconductor solar cell having top and bottom sides, solder connecting said bottom side of the solar cell and said front surface of the spacer, and leads connected to the solar cell.

2. A module as in claim 1 together with a diffuser type cover plate and a transparent adhesive securing the cover plate to the top of the cell.

3. A module as in claim 1 wherein there are a plurality of spacers and solar cells together with U-shaped braided wires connecting said solar cells to connect the same in an electrical series connection.

4. A module as in claim 3 wherein the U-shaped sections cover three sides of the solar cells.

5. A module as in claim 1 wherein said solar cell is formed of silicon and wherein said spacer is formed of silicon.

6. A module as in claim 5 wherein said insulating layer is formed of an oxide of silicon.

7. A module as in claim 1 wherein said spacer has a thickness ranging from 10 to 20 mils.

8. A module as in claim 1 wherein said heat sink is provided with flow passages for a coolant to flow therethrough.

* * * * *